United States Patent
Gardner et al.

(10) Patent No.: US 6,924,510 B2
(45) Date of Patent: Aug. 2, 2005

(54) SILICON AND SILICON/GERMANIUM LIGHT-EMITTING DEVICE, METHODS AND SYSTEMS

(75) Inventors: Donald S. Gardner, Mountain View, CA (US); Tanay Karnik, Portland, OR (US); Jianping Xu, Portland, OR (US); Shekhar Y. Borkar, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 4 days.

(21) Appl. No.: 10/140,255

(22) Filed: May 6, 2002

(65) Prior Publication Data

US 2003/0205710 A1 Nov. 6, 2003

(51) Int. Cl.⁷ .................................... H01L 29/26
(52) U.S. Cl. .................................... 257/79; 257/103
(58) Field of Search .................................... 257/79, 103

(56) References Cited

U.S. PATENT DOCUMENTS

| | | | |
|---|---|---|---|
| 4,127,932 A | * 12/1978 | Hartman et al. | 438/58 |
| 4,730,331 A | * 3/1988 | Burnham et al. | 372/50 |
| 5,159,700 A | 10/1992 | Reid et al. | 385/14 |
| 5,280,189 A | 1/1994 | Schuppert et al. | 257/458 |
| 5,920,086 A | 7/1999 | MacFarlane et al. | 257/103 |
| 5,994,720 A | 11/1999 | Snyman et al. | 257/86 |
| 6,111,271 A | * 8/2000 | Snyman et al. | 257/80 |
| 6,504,180 B1 | * 1/2003 | Heremans et al. | 257/98 |
| 2002/0052061 A1 | 5/2002 | Fitzgerald | 438/46 |

FOREIGN PATENT DOCUMENTS

| | | | |
|---|---|---|---|
| EP | 0378112 | 7/1990 | G02B/6/42 |
| EP | 0517440 | 12/1992 | H01S/3/06 |
| EP | 0905536 | 3/1999 | G02B/6/42 |
| JP | 59-075656 | 4/1984 | H01L/27/15 |

* cited by examiner

Primary Examiner—Sara Crane
(74) Attorney, Agent, or Firm—Schwegman, Lundberg, Woessner & Kluth, P.A.

(57) ABSTRACT

A light-emitting device and optical communication system based on the light-emitting device is disclosed. The light-emitting device is formed in a float-zone substrate. The light-emitting device includes on the substrate lower surface a reflective layer and on the upper surface spaced apart doped regions. The portion of the upper surface between the doped regions is textured and optionally covered with an antireflection coating to enhance light emission. The light-emitting device can operate as a laser or as a light-emitting diode, depending on the reflectivities of the antireflection coating and the reflective layer.

31 Claims, 10 Drawing Sheets

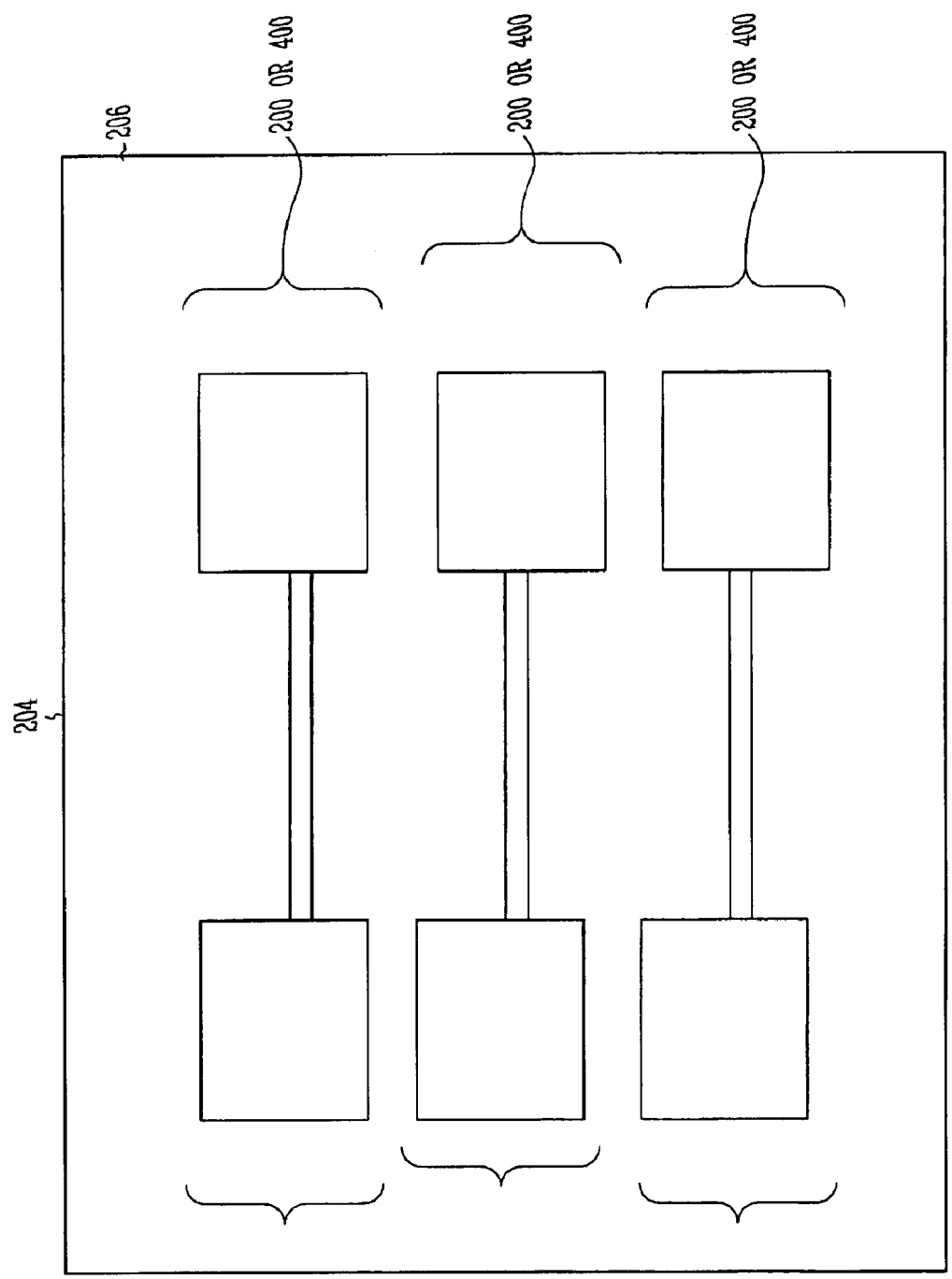

SILICON AND SILICON/GERMANIUM LIGHT-EMITTING DEVICE, METHODS AND SYSTEMS

TECHNICAL FIELD

The present invention relates to light-emitting devices formed in Si or Si/Ge and to optical communications systems employing same.

BACKGROUND INFORMATION

Modern computers are formed from a variety of different types of integrated circuit (IC) chips, such as controllers, central processing units (CPUs) and memory. On-chip and chip-to-chip interconnections within a computer are typically made with metal wires. As ICs become more integrated, the wires becomes narrower and more closely spaced. This results in a higher resistance in the wires and a higher capacitance between wires, which act to slow the electrical signal and requires more electrical power. The degree to which the electrical signal is slowed is also proportional to the square of the length of the wire. Such signal delays negatively impact the performance of IC chips and the computer as a whole.

To solve this problem, in-chip and chip-to-chip optical interconnections using light sources and waveguides have been proposed. In an optical interconnection system, an electrical signal from the chip is converted to an optical signal emitted by a light source. The light then travels over a waveguide to a detector, which converts the received light back to an electrical signal. The speed of an optical interconnection is much faster than the flow of electrons in a wire and scales linearly with the length of the optical interconnection.

Such optical interconnection systems generally require an external light source, i.e., one not integrally formed with the IC chip. This is because Si and Si/Ge, the materials presently used to form IC chips, have not been considered suitable for forming integral light sources because they have an indirect bandgap. Instead, external sources with direct bandgap semiconductors, such as vertical cavity surface emitting lasers (VCSELS) formed from AlGaAs/GaAs or strained InGaAs/GaAs quantum-well devices have been used. While these light sources are effective, they need to be separately packaged and interfaced with and aligned to the waveguide, as well as to other devices on the IC chip. This makes for a relatively complicated and expensive on-chip or chip-to-chip optical communication system.

Further complicating chip-to-chip communications is the limited number of contact pads that can be fabricated onto a chip, as well as the limited available chip area. As IC chips increase in sophistication, more and more input/output leads (e.g., pins or balls) are required to accommodate the larger number of bits and inputs/outputs for other applications.

What is needed is a cost-effective optical interconnection system for on-chip and chip-to-chip communication that utilizes a light source and detector formed integral with conventional Si or Si/Ge semiconductor substrates and that is compatible with standard IC fabrication processes.

BRIEF DESCRIPTION OF THE DRAWINGS

FIG. 11 is a plan view of multiple optical communication systems formed on an IC chip;

DETAILED DESCRIPTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

With reference to FIGS. 1–7 described briefly above, a method of forming an example embodiment of the light-emitting device of the present invention is now described.

Figure 1:
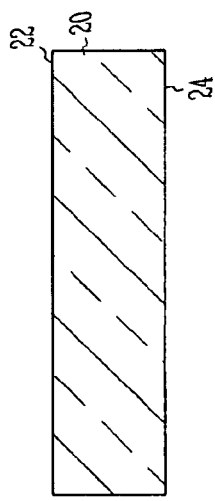
FIG. 1 is a cross-sectional view of a float-zone Si or Si/Ge substrate.

In FIG. 1, a substrate 20 with an upper surface 22 and a lower surface 24 is provided. In one embodiment, the substrate is float-zone. In particular, in one-example embodiment, the substrate is float-zone silicon (Si), while in another example embodiment the substrate is float-zone silicon/germanium (Si/Ge). Use of a float-zone substrate is preferred because such a substrate has few if any oxygen impurities, which can cause bulk defects that contribute to non-radiative carrier recombination. Substrate 20 can be p-type or n-type.

Figure 2:
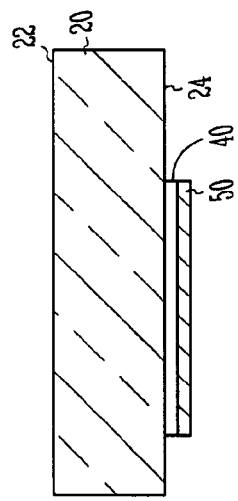
FIG. 2 is the float-zone substrate of FIG. 1, processed to form an oxide and reflective layer on a portion of the substrate lower surface.

In FIG. 2, a dielectric layer 40 is formed on lower surface 24. In an example embodiment, the dielectric layer includes an oxide formed by heating lower surface 24 in an oxygen atmosphere at high temperature. Example oxides include $SiO_2$ and $Al_2O_3$. In another example embodiment, dielectric layer includes a nitride.

A reflective layer 50 is then formed over the dielectric layer. In an example embodiment, reflective layer 50 is a metal, such as aluminum. Further in an example embodiment, the reflective layer is formed by metalization. The dielectric layer serves to electrically insulate the reflective layer from the substrate.

Figure 3:
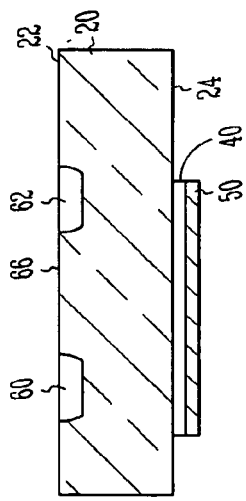
FIG. 3 is the substrate of FIG. 2, further processed to form n+ and p+ doped regions in the substrate upper surface.

In FIG. 3, spaced apart doped regions 60 and 62 are formed in upper surface 22 of substrate 20. In an example embodiment, the doped regions are n+ and p+. Example n-type dopants are As, P and N, while example p-type dopants are B, $BF_2^+$, Ga and Al.

Figure 4:
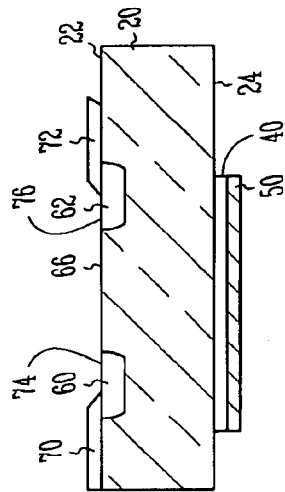
FIG. 4 is the substrate of FIG. 3, further processed to form insulators on the substrate upper surface over a portion of the n+ and p+ doped regions.

The doped regions define a surface region 66 in between the doped regions. In one embodiment, gas source diffusion is used to form the doped regions. In another embodiment, ion-implantation is used, followed by an anneal step to eliminate any crystal dislocations that could contribute to non-radiative carrier recombination. In FIG. 4, insulators 70 and 72 are formed atop upper surface 22 over respective portions of the doped regions 60 and 62, leaving exposed portions 74 and 76 of the doped regions. In an example embodiment, insulators 70 and 72 are formed by selectively depositing $SiO_2$.

Figure 5:
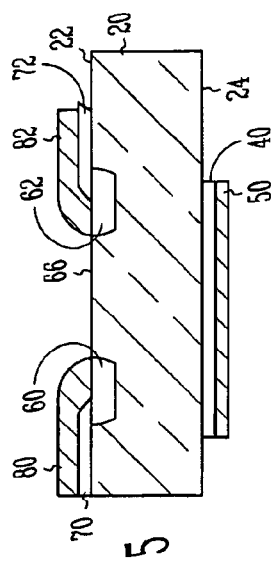
FIG. 5 is the substrate of FIG. 4, further processed to form metal contacts over the insulators and over the exposed portion of the n+ and p+ doped regions.

In FIG. 5, metal contacts 80 and 82 are formed over insulators 70 and 72 to contact exposed portions 74 and 76, respectively. The metal contacts may be formed from any one of a number of conductors, such as W, Al or a silicide. The metal contacts are also designed to provide a relative small amount of surface area contact. In an example embodiment, the contact surface area is about 1% or less of the total upper surface area of the light-emitting device.

Figure 6:
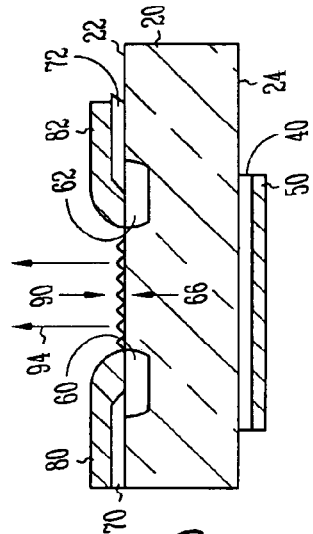
FIG. 6 is the substrate of FIG. 5, further processed to form a textured portion in the upper surface between the n+ and p+ doped regions.

In FIG. 6, at least a portion of surface region 66 is textured (i.e., roughened) to form a textured surface 90. The texturing is performed to increase the surface area to facilitate the emission of light 94 from the device. In an example embodiment, the textured surface is formed by etching with KOH.

Figure 7:
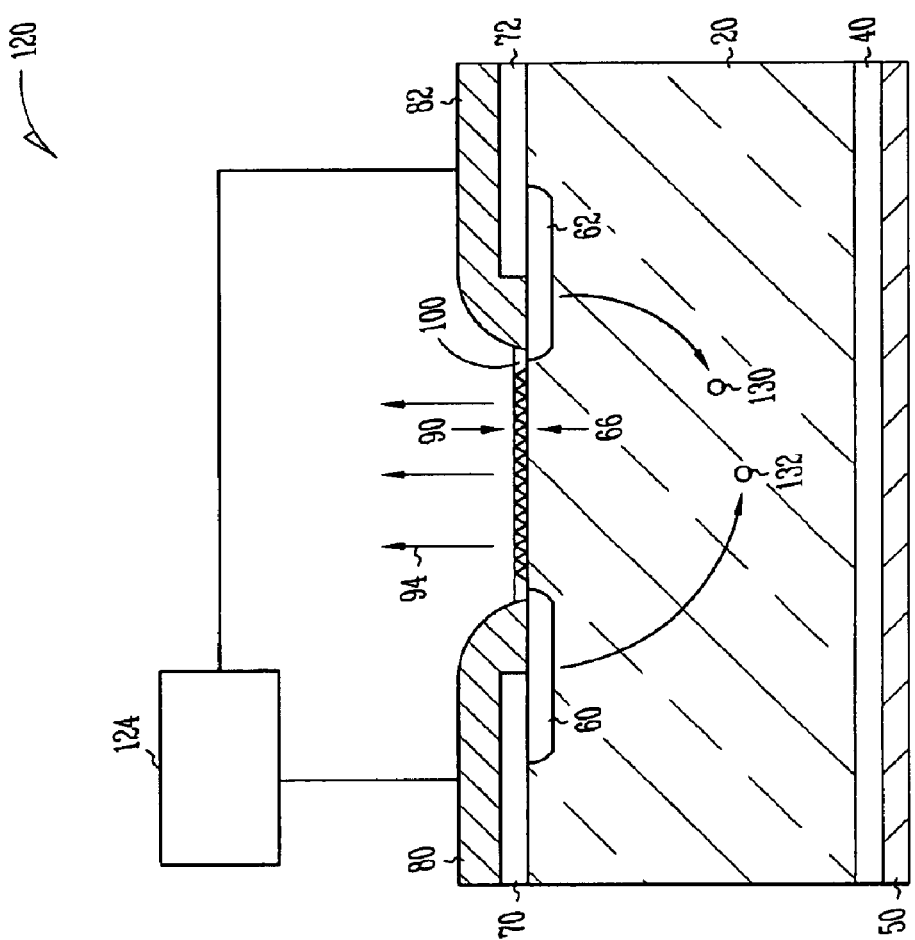
FIG. 7 is the substrate of FIG. 6, further processed to form an antireflection coating over the textured portion of the upper surface, thereby completing the formation of the light-emitting device of the present invention.

In FIG. 7, in an example embodiment an antireflection (AR) coating 100 is optionally formed over textured surface 90 to further enhance light emission from the device. The AR coating material and thickness is selected for the wavelength of light generated, and may include multiple thin-film layers. In an example embodiment, the thickness of the AR coating is chosen to be equal to or substantially equal to ¼ of the wavelength of emitted light as measured within the material constituting the AR coating. In an example embodiment, the wavelength of light is 1100 nm and the AR coating includes SiN.

The structure resulting from the above-described method is an Si— or Si/Ge-based light-emitting device 120. In one example embodiment, reflective layer 50 and AR coating 100 have reflectivities designed to make the light-emitting device operate as a laser diode (LD). In another example embodiment, reflective layer 50 and AR coating 100 have reflectivities designed to make light-emitting device 120 operate as a non-coherent light-emitting diode (LED).

With continuing reference to FIG. 7, an example embodiment of light-emitting device 120 with n+ and p+ doped regions operates as follows. A voltage from a voltage source 124 is applied across metal contacts 80 and 82. This causes electrons 130 to diffuse through the substrate away from (n+) doped region 60 and holes 132 to diffuse through the substrate away from (p+) doped region 62. Within the substrate, recombination of electrons and holes occurs. For indirect bandgap materials such as Si and Si/Ge, the electron-hole pairs normally diffuse a long time before radiative recombination occurs. In addition, bulk, surface, and contact non-radiative recombinations occur that can overwhelm the radiative recombinations.

In light-emitting device 120, the sources of non-radiative recombination are reduced so that light 94 is emitted via radiative recombinations. In this sense, the light-emitting device of the present invention has properties in common with a solar cell—namely, use of a float-zone substrate and the reduction of surface, contact and bulk-defect non-radiative recombination effects. The main differences between the present invention and a solar cell (besides the emission vs. reception of light) is that the present invention has the doped regions formed in the upper surface as opposed to the upper and lower surfaces, uses minimal surface area for the contacts, and has an AR coating designed for the wavelength of light emitted by the device based on the bandgap of Si or Si/Ge, rather than based on the reception of sunlight wavelengths.

The result is that light-emitting device 120 has an efficiency, defined as the percentage ratio of the "power in" to the "power out" (e.g., in Watts), of about 0.25% or greater. This level of efficiency makes the indirect bandgap light-emitting device of the present invention a viable integrated light source for performing on-chip and chip-to-chip communication.

In example embodiment discussed in greater detail below in connection with FIG. 10, a modulator (406) can be placed downstream of the light-emitting device to quickly switch the light beam. Reflection of a light beam or re-routing of a light beam can be achieved by applying a voltage to the modulator. Semiconductor modulators are typically capable of operating at high speeds and can be integrated with other electronic devices, such as those discussed below.

On-Chip Communication system

Figure 8A:
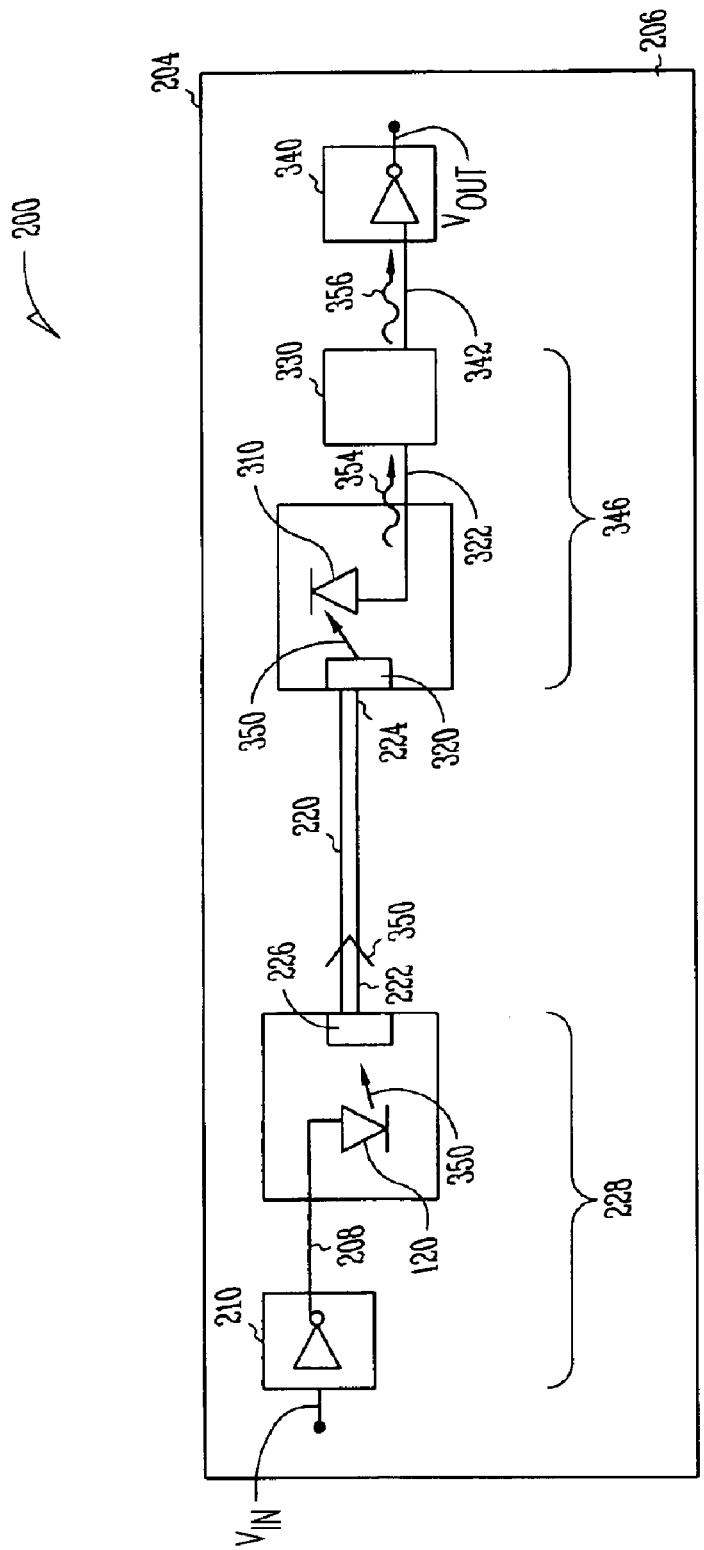
FIG. 8A is a plan view of an example embodiment of an on-chip optical communication system that uses the light-emitting device of FIG. 7.
Figure 8B:
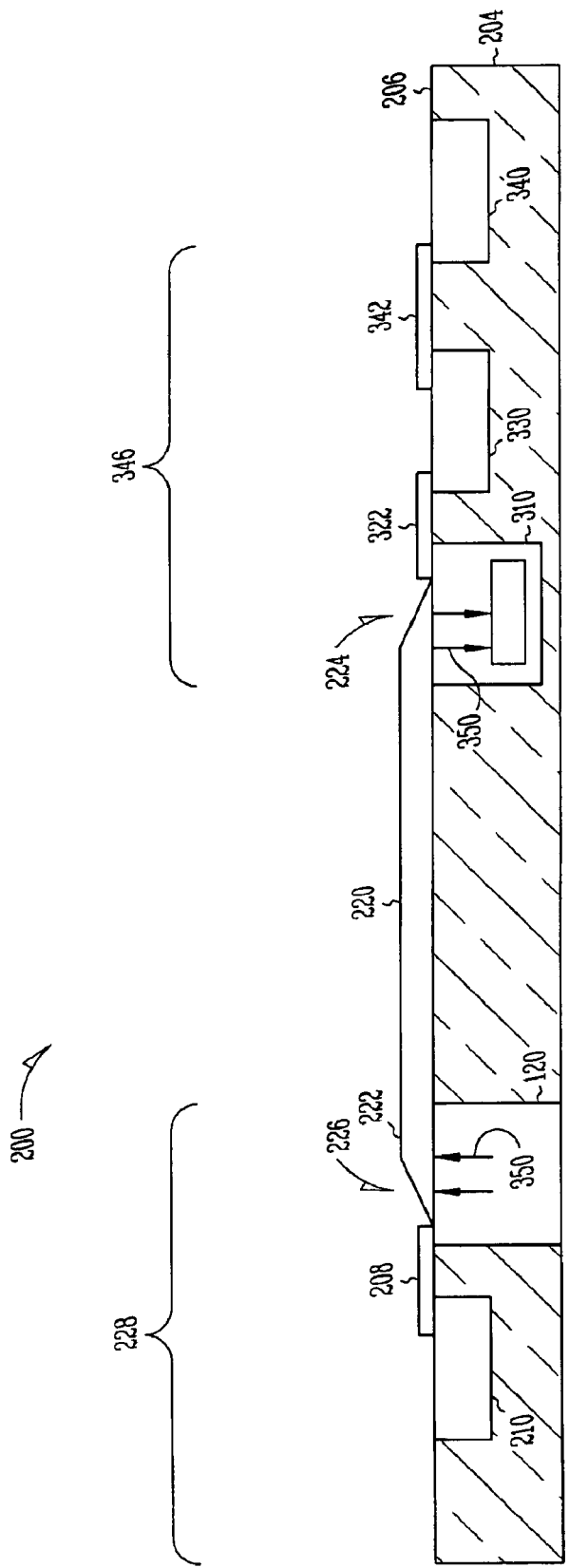
FIG. 8B is cross-sectional view of the system of FIG. 8A.

FIG. 8A is a plan view of an example embodiment of an on-chip optical communication system 200 that uses the light-emitting device of FIG. 7. System 200 is formed in a chip 204 with an upper surface 206. FIG. 8B is cross-sectional view of system 200.

System 200 includes the light-emitting device 120 formed integral with the chip and operating in the present example embodiment as an LD (hereinafter, "LD 120"). Light-emitting device 150 can also be employed in system 200, and LD 120 is chosen for illustration purposes. LD 120 is electrically connected via a wire 208 to a driver 210. An input voltage $V_{IN}$ is provided to the driver.

System 200 includes an optical waveguide 220 formed on or in upper surface 206. The optical waveguide includes an input end 222 and an output end 224. Optical waveguide 220 is optically coupled at the input end to LD 120. In an example embodiment, the optical coupling is achieved using an optical coupler device 226, such as a prism, a grating, a lens, a mirror, or any combination thereof. LD device 120, driver 210 and optical coupler device 226 constitute a light-transmitting portion 228 of system 200.

In an example embodiment, the optical waveguide is part of a polymer waveguide sheet laminated to upper surface 206. Polymer waveguides are particularly well suited for transmitting light of infrared wavelength (e.g., 0.850 microns to about 1.55 microns), which are commonly used wavelengths for chip-to-chip and other optical telecommunications applications. Suitable polymer waveguide sheets are available from Optical Crosslinks, Inc., Kennet Square, Pa.

Figure 9A:
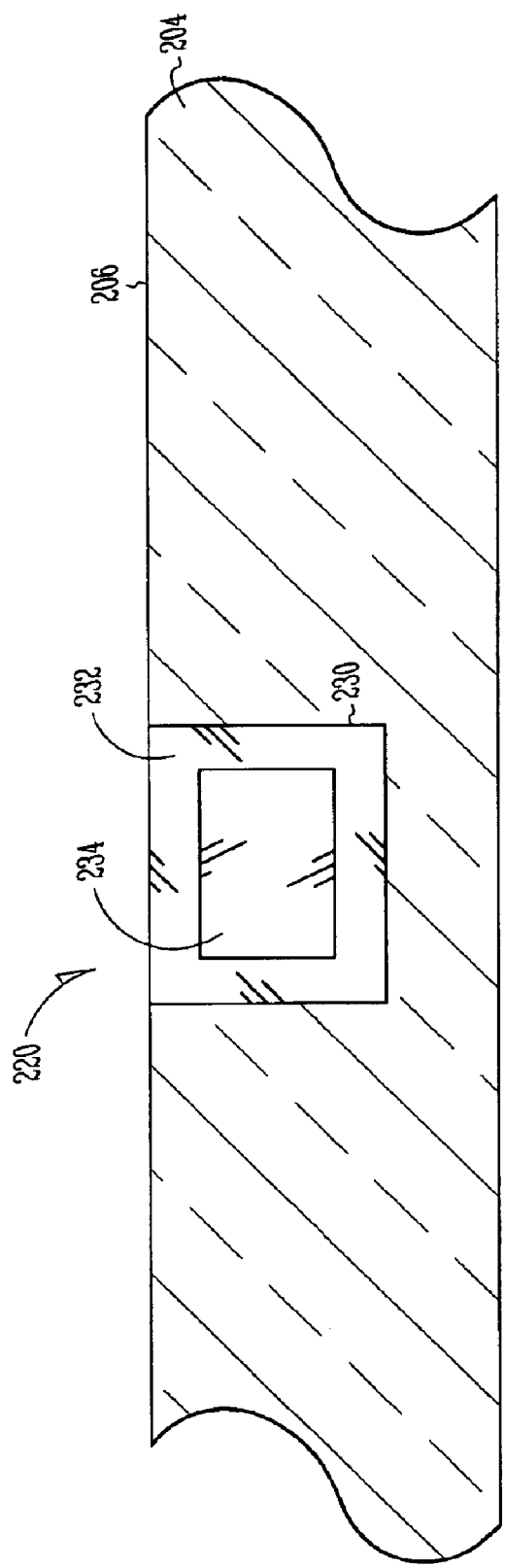
FIG. 9A is an example embodiment of forming a channel optical waveguide for the system of FIG. 8A.

In another example embodiment, optical waveguide 220 is formed in the surface of the chip. FIG. 9A is an example embodiment of forming a channel optical waveguide for system 200 (FIG. 8A). With reference to FIG. 9A, one such technique includes forming a channel 230 in the upper surface and lining the channel with a low-index material 232, such as a low-index polyimide. The lined channel is then filled with a high-index cladding layer 234, such as a high-index polyimide. Another layer of low-index material 232 is then deposited atop the high-index layer to complete the cladding.

Figure 9B:
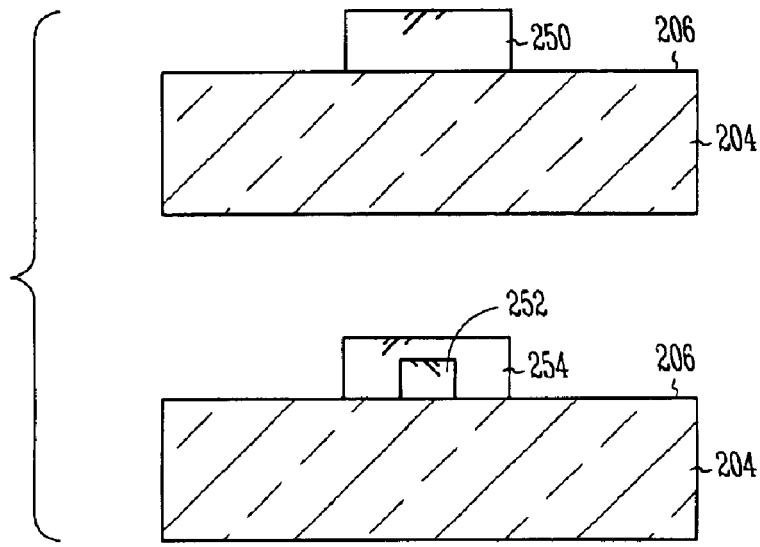
FIG. 9B is an example embodiment of forming the optical waveguide for the system of FIG. 8A.

FIG. 9B is another example embodiment of forming the optical waveguide for system 200. With reference to FIG. 9B, the technique for forming optical waveguide 220 involves depositing a first layer 250 of high-index core material atop upper surface 206, patterning the first layer to form a high-index waveguide core 252, and then depositing a low-index cladding layer 254 atop the waveguide core.

Figure 9C:
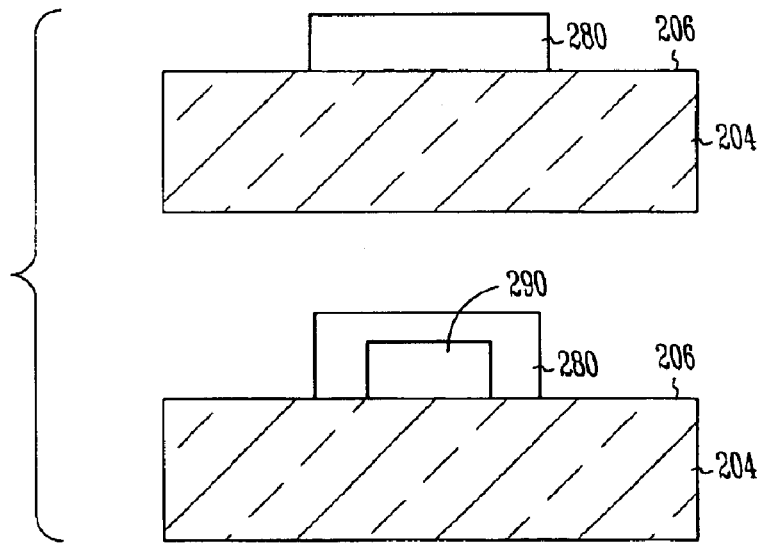
FIG. 9C is an example embodiment of forming the optical waveguide for the system of FIG. 8A using a photosensitive polymer.

FIG. 9C is an example embodiment of forming the optical waveguide for system 200 using a photosensitive polymer. With reference to FIG. 9C, the technique for forming optical waveguide 220 involves depositing a layer 280 of photosensitive polymer that undergoes a change in refractive index when exposed to a select wavelength of radiation. An example polymer is acrylate, available from Dupont, Inc., Wilmington, Del. The waveguide array is then formed by selectively irradiating the photosensitive polymer (e.g., by masking the layer 280) with radiation 286 of the select wavelength to form a high-index region 290 within layer 280. Additional low-index material from layer 280 is then formed atop the structure to complete the cladding.

With reference again to FIGS. 8A and 8B, output end 224 of optical wavguide 220 is optically coupled to a photodetector 310 formed integral with chip 204. In an example embodiment, the optical coupling is achieved using an optical coupler device 320, such as a prism, a grating, a lens, a mirror, or any combination thereof. Photodetector 310 is electrically connected via wire 322 to a transimpedance amplifier 330, which in turn is connected to a post-amplifier 340 via wire 342. Optical coupler device 224, photodetector 310 and transimpedance amplifier 330 constitute a light-receiving portion 346 of system 200.

In operation, driver 210 receives input voltage $V_{IN}$ and in response thereto, drives LD 120 to output a modulated optical signal 350. Optical signal 350 is coupled into optical waveguide 220 and travels down the waveguide where it is received and detected by photodetector 310. The photodetector outputs a photodetector current signal 354 corresponding to optical signal 350. Current signal 354 travels to transimpedance amplifier 330, which converts the current signal to a voltage signal 356. This voltage signal is then amplified by post-amplifier 340 and outputted therefrom as $V_{OUT}$.

Figure 10:
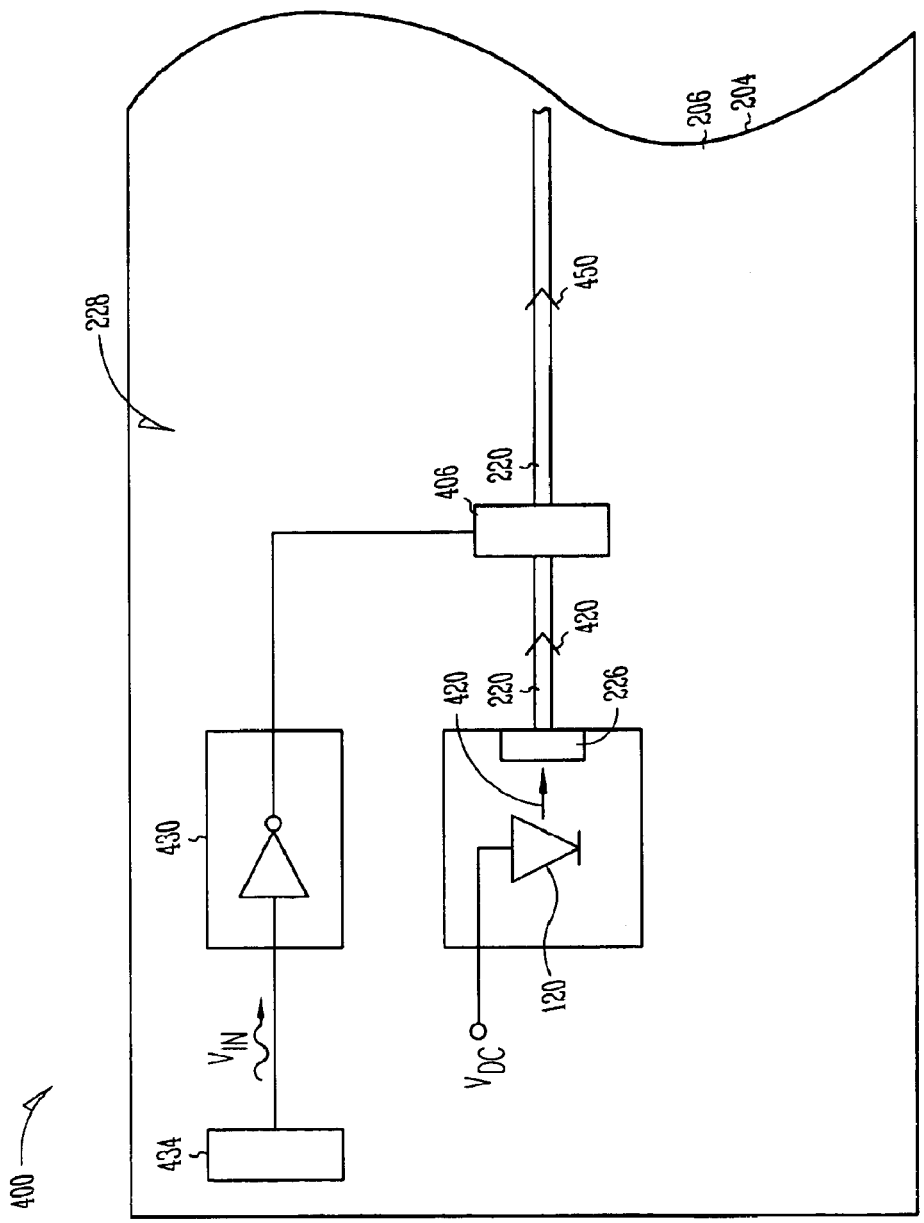
FIG. 10 is a close-up plan view of the light-emitting portion of another embodiment of an on-chip optical communication system as an alternate embodiment of the system of FIG. 8A, where the light-emitting device is an LED and where the system includes an optical modulator to modulate the light from the LED.

FIG. 10 is a close-up plan view of the light-emitting portion 228 of another example embodiment of an on-chip optical communication system 400 as an alternate embodiment of system 200, where the light-emitting device is an LED and where the system includes an optical modulator to modulate the light from the LED. In system 400, light-emitting device 120 operates as an LED (hereinafter, LED 120). Further, an optical modulator 406 is arranged adjacent the LED output (e.g., in the optical waveguide). Also, LED 120 is electrically connected to a direct current (DC) voltage $V_{DC}$ and produces a continuous DC output beam 420. System 200 further includes a driver 430 electrically connected to optical modulator 406 and to $V_{IN}$. In an example embodiment, input voltage $V_{IN}$ is provided by an on-chip device 434, such as a CPU.

In operation, driver 430 drives the optical modulator in response to $V_{IN}$, thereby creating a modulated output beam 450 from continuous output beam 420. The modulated output beam then travels down optical waveguide 220. The rest of the system and its operation is the same as that of system 200, described above.

FIG. 11 is a plan view of multiple optical communication systems 200 or 400 formed on an IC chip 200. The multiple systems provide for multiple communication paths on the chip.

Chip-to-Chip Communication System

Figure 12A:
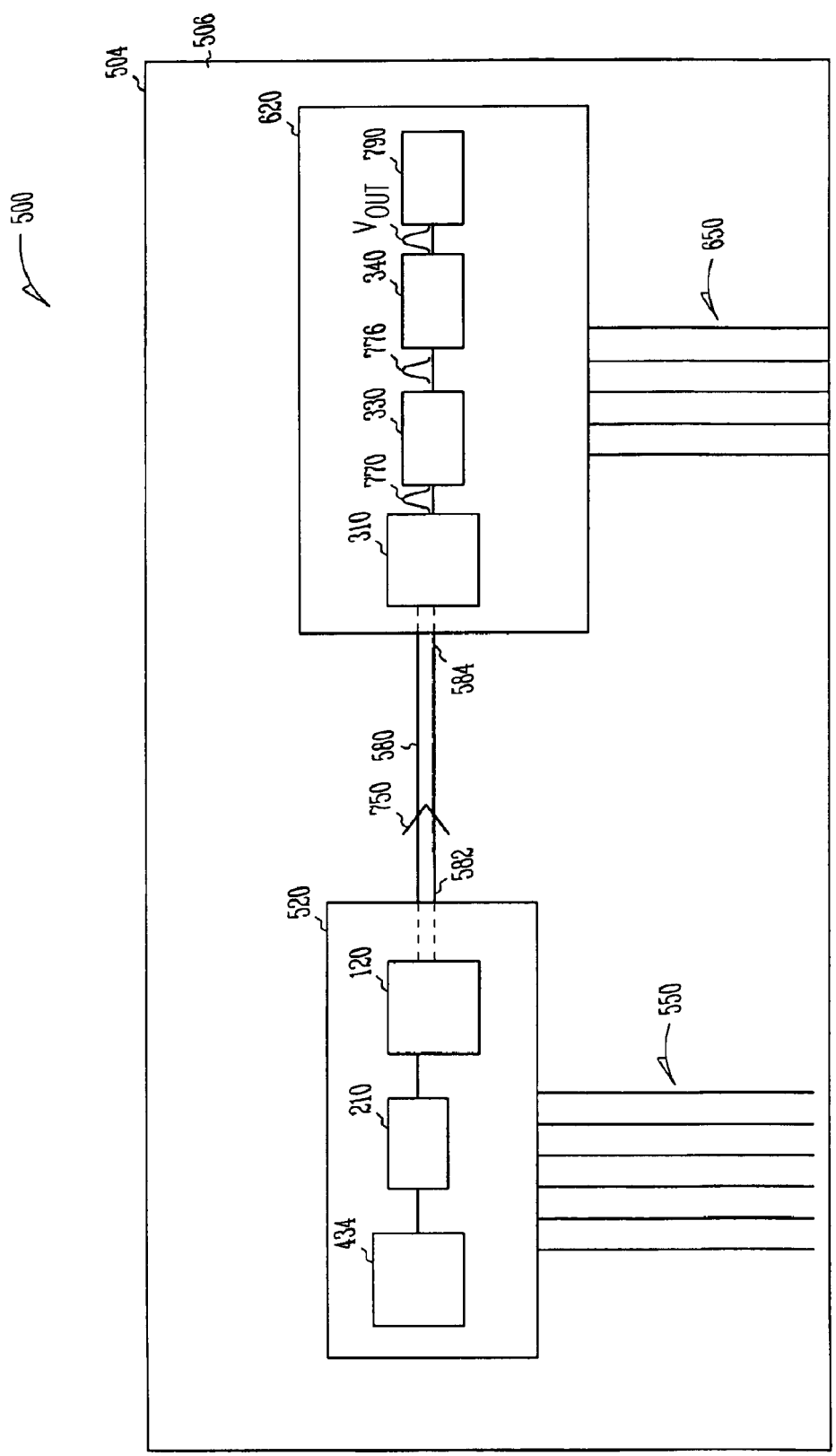
FIG. 12A is a plan view of a chip-to-chip communication system that uses the light-emitting device of FIG. 7.
Figure 12B:
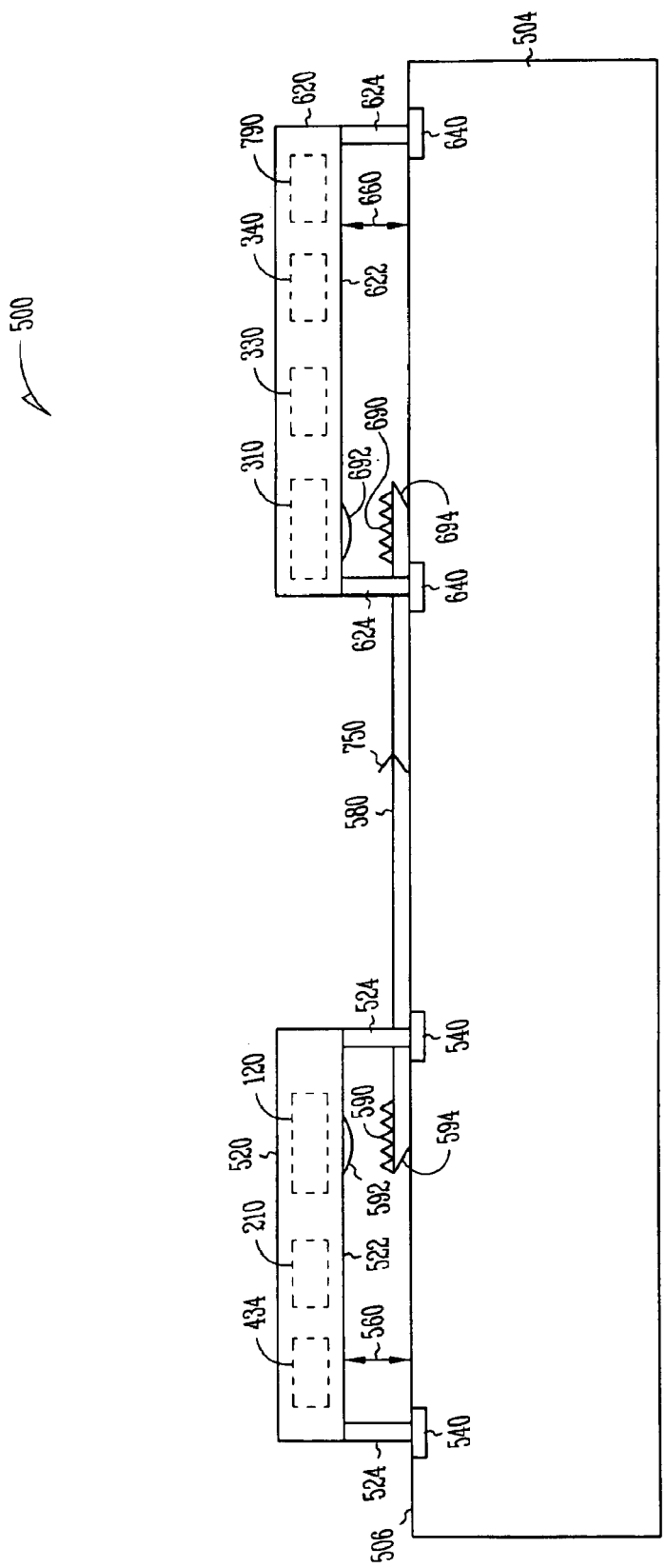
FIG. 12B is a side view of the system of FIG. 12A.

FIG. 12A is a plan view of a chip-to-chip communication system 500 that uses light-emitting device 120 (FIG. 7), while FIG. 12B is a side view of system 500. System 500 is formed on a chip-bearing substrate 504 having an upper surface 506. In one example embodiment of system 500, the chip-bearing substrate is a printed circuit board (PCB). In another example embodiment, the chip-bearing substrate is an interposer, which is a passive device containing wiring that provide a spatial transformation between the closely spaced leads of an IC chip and the more widely spaced contacts of a PCB.

System 500 includes an IC chip 520 with a lower surface 522 and external leads 524 connected to contacts 540 formed on the upper surface of the chip-bearing substrate. Contacts 540 are connected to wires 550 formed either on the upper surface of the chip-bearing substrate (as with a PCB, as shown), or formed internal to the substrate (as with an interposer). In an example embodiment, leads 524 are pins and contacts 540 are holes, while in another example embodiment, the leads are solder balls and the contacts are pads to which the solder balls are flip-chip bonded. In an example embodiment, leads 524 are contacted to contacts 540 such that IC chip lower surface 522 and upper surface 506 of the chip-bearing substrate are separated by a gap 560.

IC chip 520 includes, in an example embodiment, light-emitting device 120 operating as a laser (i.e., LD 120), and driver 210 connected thereto, as described above in connection with system 200. Power to the chip is provided by one of the wires 550 connected to a power supply (not shown). In an example embodiment, $V_{IN}$ is provided from another device 434, such as a CPU, formed integral with the IC chip. In an example embodiment, driver 210 includes a CPU.

System 500 includes an optical waveguide 580 with an input end 582 and an output end 584 formed on surface 506 of the chip-bearing substrate. Optical waveguide 580 is essentially the same as optical waveguide 220 and can be formed on or in surface 506 using the same methods as described above for forming waveguide 220 as discussed in connection with FIGS. 9A, 9B and 9C. Optical waveguide 580 is optically coupled at the input end to LD 120. In an example embodiment, the optical coupling is achieved using an optical coupler device, such as a grating 590, a lens 592, a bevel 594, or any combination thereof.

System 500 further includes an IC chip 620 with a lower surface 622 and external leads 624 connected to contacts 640 formed on the upper surface of the chip-bearing substrate. Contacts 640 are connected to wires 650 formed either on the upper surface of the chip-bearing substrate (as with a PCB, as shown), or formed internal to the substrate (as with an interposer). In an example embodiment, leads 624 are pins and contacts 640 are holes, while in another example embodiment, the leads are solder balls and the contacts are pads to which the solder balls are flip-chip bonded. In an example embodiment, leads 624 are contacted to contacts 640 such that IC chip lower surface 622 and upper surface 506 of the chip-bearing substrate are separated by a gap 660.

IC chip 620 includes, in an example embodiment, photodetector 310 connected to transimpedance amplifier 330, which in turn is connected to post-amplifier 340, as described above in connection with system 200. Photodetector 310 of IC chip 620 is optically coupled to output end 584 of optical waveguide 580. In an example embodiment, the optical coupling is achieved using an optical coupler device, such as a grating 690, a lens 692, a bevel 694, or any combination thereof.

In operation, driver 210 receives input voltage $V_{IN}$ and in response thereto, drives LD 120 to output a modulated optical signal 750. Modulation can also be achieved by using a separate optical modulator such as modulator 406 (FIG. 10). Optical signal 750 is coupled into optical waveguide 580 and travels down the waveguide where it is received and detected by photodetector 310. The photodetector outputs a photodetector current signal 770 that travels to transimpedance amplifier 330, which converts the output current signal to a voltage signal 776. The voltage signal is then amplified by post-amplifier 340 and outputted therefrom as $V_{OUT}$. The voltage signal $V_{OUT}$ is then available for processing by another device in the chip, such as CPU 790.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

While certain elements have been described herein relative to "upper" and "lower", and "horizontal" and "vertical", it will be understood that these descriptors are relative, and that they could be reversed if the elements were inverted, rotated, or mirrored. Therefore, these terms are not intended to be limiting.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in various example embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A light-emitting device comprising:
    a substrate formed from a float-zone semiconductor material;
    a dielectric layer formed on a lower substrate surface and a reflective layer formed atop the dielectric layer;
    spaced apart doped regions formed in an upper substrate surface, with a textured surface portion formed between the doped regions;
    first and second metal contacts that contact respective portions of the doped regions; and wherein the light-emitting device has an efficiency of about 0.25% or greater.

2. The light-emitting device of claim 1, including an antireflection coating formed over the textured surface portion, wherein the antireflection coating and the reflective layer have reflectivities such that the light-emitting device is operable as a laser diode.

3. The light-emitting device of claim 1, including an antireflection coating formed over the textured surface portion, wherein the antireflection coating and the reflective layer have reflectivities such that the light-emitting device is operable as a non-coherent light-emitting diode.

4. The light-emitting device of claim 1, wherein the light-emitting device is capable of emitting light having a wavelength of about 1100 nm.

5. The light-emitting device of claim 1, further including an antirefletive coating formed over the roughened surface portion, the antireflection coating having a thickness equal to or substantially equal to ¼ of a wavelength of light emitted by the light-emitting device.

6. The light-emitting device of claim 1, wherein the first and second metal contacts have a contact surface area that is 1% or less of a total upper surface area of the light-emitting device.

7. A light-emitting device comprising:
    a substrate formed from a float-zone semiconductor material;
    a dielectric layer formed on a lower substrate surface and a reflective layer formed atop the dielectric layer;
    spaced apart doped regions formed in an upper substrate surface, with a textured surface portion formed between the doped regions;
    first and second metal contacts that contact respective portions of the doped regions; and further including an optical waveguide optically coupled to the textured surface portion.

8. A system comprising:
    a substrate formed from float-zone Si or float-zone Si/Ge;
    an indirect bandgap light-emitting device formed integral with the substrate, the light-emitting device having an efficiency of 0.25% or greater;
    an optical waveguide formed atop or within an upper surface of the substrate and optically coupled at a first waveguide end to the light-emitting device; and
    a photodiode formed integral with the substrate and optically coupled to a second waveguide end of the optical waveguide.

9. The system of claim 8, wherein the light-emitting device includes:
    a reflective layer formed adjacent a portion of a substrate lower surface and insulated from the lower surface by an dielectric layer;
    spaced apart doped regions formed in an upper substrate surface with an antireflection-coated textured surface portion formed therebetween; and
    first and second metal contacts respectively contacting a portion of the doped regions.

10. The system of claim 9, further including a driver electrically connected to the light-emitting device.

11. The system of claim 10, further including a transimpedance amplifier formed integral with the substrate and electrically connected to the photodiode.

12. The system of claim 11, further including a post-amplifier formed integral with the substrate and electrically connected to the transimpedance amplifier.

13. The system of claim 8, including first and second optical coupler devices at or near the respective first and second waveguide ends, the first optical coupler adapted to couple light from the light-emitting device into the optical waveguide, and the second optical coupler device adapted to couple light from the optical waveguide to the photodiode.

14. The system of claim 8, further including:
an optical modulator arranged downstream of the light-emitting device; and
a driver electrically connected to the optical modulator.

15. The system of claim 14, wherein the light-emitting device is adapted to operate as a light-emitting diode and provide a continuous output beam.

16. A system, comprising:
a chip-bearing substrate with an upper surface;
a first IC chip formed from a float-zone Si or float-zone Si/Ge substrate and electrically connected to the chip-bearing substrate, the first IC chip including an indirect-bandgap light-emitting device formed integral with the substrate, the light-emitting device having an efficiency of 0.25% or greater;
an optical waveguide formed atop or within the upper surface and optically coupled at a first waveguide end to the light-emitting device; and
a second IC chip electrically connected to the substrate and having a photodiode optically coupled to a second waveguide end.

17. The system of claim 16, wherein the light-emitting device includes:
a reflective layer formed adjacent a portion of a substrate lower surface and insulated from the lower surface by an dielectric layer;
spaced apart doped regions formed in an upper substrate surface with an antireflection-coated textured surface portion formed therebetween; and
first and second metal contacts respectively contacting a portion of the doped regions.

18. The system of claim 16, wherein the first IC chip includes a driver electrically connected to the light-emitting device.

19. The system of claim 18, wherein the first IC chip includes a CPU electrically connected to the driver.

20. The system of claim 16, further including:
an optical modulator arranged downstream of the light-emitting device; and
a driver electrically connected to the optical modulator.

21. The system of claim 20, wherein the light-emitting device is adapted to operate as a light-emitting diode and provide a continuous output beam.

22. A method comprising:
providing an input voltage to an indirect bandgap light-emitting device having an efficiency of 0.25% or greater and formed integral with an IC chip substrate made of float-zone Si or float-zone Si/Ge;
generating an optical signal with the light-emitting device in response to the input voltage;
coupling the optical signal into a first end of an optical waveguide formed on or in the IC chip substrate; and
receiving and detecting the optical signal with a photo-detector formed integral with the IC chip and optically coupled to a second end of the optical waveguide.

23. The method of claim 22, further including generating a current signal with the photodetector and converting the current signal to an output voltage.

24. The method of claim 22, further including generating the input voltage with a CPU formed integral with the IC chip.

25. The method of claim 22, wherein generating the optical signal includes modulating a continuous-beam output from the light-emitting device.

26. The method of claim 22, wherein generating the optical signal includes driving the light-emitting device to produce a modulated output beam.

27. A method comprising:
electrically connecting a first IC chip to a chip-bearing substrate;
in the first IC chip, providing an input voltage to an indirect bandgap light-emitting device having an efficiency of 0.25% or greater and formed integral with an IC chip substrate made of float-zone Si or float-zone Si/Ge;
generating an optical signal with the light-emitting device in response to the input voltage;
coupling the optical signal into a first end of an optical waveguide formed on or in the chip-bearing substrate; and
receiving and detecting the optical signal with a photo-detector formed integral with a second IC chip electrically connected to the chip-bearing substrate, the photodetector optically coupled to a second end of the optical waveguide.

28. The method of claim 27, further including generating a current signal with the photodetector and converting the current signal to an output voltage.

29. The method of claim 28, including generating the input voltage with a CPU formed integral with the first IC chip.

30. The method of claim 27, wherein generating the optical signal includes modulating a continuous-beam output from the light-emitting device.

31. The method of claim 27, wherein generating the optical signal includes driving the light-emitting device to produce a modulated output beam.

* * * * *

UNITED STATES PATENT AND TRADEMARK OFFICE
CERTIFICATE OF CORRECTION

PATENT NO. : 6,924,510 B2
DATED : August 2, 2005
INVENTOR(S) : Gardner et al.

It is certified that error appears in the above-identified patent and that said Letters Patent is hereby corrected as shown below:

Column 8,
Line 18, delete "antirefletive" and insert -- antireflective --, therefor.

Signed and Sealed this

Twenty-second Day of November, 2005

JON W. DUDAS
*Director of the United States Patent and Trademark Office*